United States Patent
Tai et al.

(10) Patent No.: US 8,709,895 B2
(45) Date of Patent: Apr. 29, 2014

(54) MANUFACTURING METHOD POWER SEMICONDUCTOR DEVICE

(75) Inventors: Sung-Shan Tai, San Jose, CA (US); Hung-Sheng Tsai, Tainan (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 284 days.

(21) Appl. No.: 13/038,346

(22) Filed: Mar. 1, 2011

(65) Prior Publication Data
US 2012/0112268 A1 May 10, 2012

(30) Foreign Application Priority Data
Nov. 4, 2010 (TW) ............................ 99137930 A

(51) Int. Cl.
 *H01L 21/336* (2006.01)
(52) U.S. Cl.
 USPC ............... 438/270; 438/589; 257/E21.419
(58) Field of Classification Search
 USPC ............ 438/270, 589; 257/330, E21.419, 257/E29.258
 See application file for complete search history.

(56) References Cited

U.S. PATENT DOCUMENTS

| | | | |
|---|---|---|---|
| 5,430,324 A | 7/1995 | Bencuya | |
| 5,605,852 A | 2/1997 | Bencuya | |
| 6,309,929 B1 * | 10/2001 | Hsu et al. ..................... | 438/270 |
| 6,396,090 B1 | 5/2002 | Hsu | |
| 6,998,315 B2 | 2/2006 | Hsieh | |
| 7,368,353 B2 * | 5/2008 | Cao et al. ..................... | 438/270 |
| 7,524,726 B2 * | 4/2009 | Ma ................................ | 438/270 |
| 8,415,739 B2 * | 4/2013 | Venkatraman et al. ....... | 257/330 |
| 8,431,457 B2 * | 4/2013 | Chang et al. .................. | 438/270 |
| 2005/0167744 A1 | 8/2005 | Yilmaz | |
| 2006/0244029 A1 | 11/2006 | Moens | |
| 2006/0267044 A1 | 11/2006 | Yang | |
| 2007/0228518 A1 | 10/2007 | Yilmaz | |
| 2008/0135931 A1 | 6/2008 | Challa | |
| 2009/0008709 A1 | 1/2009 | Yedinak | |
| 2010/0123193 A1 * | 5/2010 | Burke et al. ................. | 438/589 |
| 2011/0037120 A1 * | 2/2011 | Chen et al. .................... | 257/331 |
| 2011/0233666 A1 * | 9/2011 | Lui et al. ....................... | 438/270 |
| 2011/0291186 A1 * | 12/2011 | Yilmaz et al. ................ | 438/589 |
| 2013/0168731 A1 * | 7/2013 | Hsieh ............................ | 438/270 |

FOREIGN PATENT DOCUMENTS

| | | |
|---|---|---|
| CN | 101211981 A | 7/2008 |
| CN | 101807574 A | 8/2010 |
| TW | 223865 B1 * | 11/2004 |
| TW | I237331 | 8/2005 |
| TW | I261907 | 9/2006 |
| TW | I308375 | 4/2009 |
| TW | I310590 | 6/2009 |
| TW | 201023273 | 6/2010 |

* cited by examiner

*Primary Examiner* — Zandra Smith
*Assistant Examiner* — Toniae Thomas
(74) *Attorney, Agent, or Firm* — Winston Hsu; Scott Margo

(57) ABSTRACT

The present invention provides a termination structure of a power semiconductor device and a manufacturing method thereof. The power semiconductor device has an active region and a termination region. The termination region surrounds the active region, and the termination structure is disposed in the termination region. The termination structure includes a semiconductor substrate, an insulating layer and a metal layer. The semiconductor substrate has a trench disposed in the termination region. The insulating layer is partially filled into the trench and covers the semiconductor substrate, and a top surface of the insulating layer has a hole. The metal layer is disposed on the insulating layer, and is filled into the hole.

13 Claims, 23 Drawing Sheets

MANUFACTURING METHOD POWER SEMICONDUCTOR DEVICE

BACKGROUND OF THE INVENTION

1. Field of the Invention

The present invention relates to a termination structure of a power semiconductor device and a manufacturing method thereof, and more particularly, to a termination structure of a power semiconductor device having a trench and a manufacturing method thereof.

2. Description of the Prior Art

Power semiconductor devices are typical semiconductor devices in power management applications, such as a switching power supply, a power control IC of a computer system or peripherals, a power supply of a backlight, motor controller, etc. Power semiconductor devices can include various kinds of transistors, such as an insulated gate bipolar transistor (IGBT) and a metal-oxide-semiconductor field effect transistor (MOSFET).

Because the power semiconductor device is designed to tolerate high voltage, an active device of the power semiconductor device usually is provided with high current. In order to prevent the semiconductor device from being broken down or having channeling effect with other devices, the power semiconductor device according to the prior art usually disposes a termination structure in a peripheral region surrounding the active device to avoid a voltage break down phenomenon and isolate the influence of the active device on the outside devices. The popular termination structure in the prior art is local oxidation of silicon (LOCOS), field plate or guard ring.

Refer to FIG. 1, which is a schematic diagram illustrating a power semiconductor device utilizing a field oxide layer to be a termination structure according to the prior art. As shown in FIG. 1, the semiconductor substrate 10 includes an N-type substrate 12 and an N-type epitaxial layer 14, and the semiconductor substrate 10 has an active region 16 and a peripheral region 18. The N-type epitaxial layer 14 in the active region 16 has a plurality of trenches 20, and the gate oxide layer 22 and the polysilicon layer 24 are respectively formed in each trench 20. In addition, the field oxide (FOX) layer 26 is formed on the N-type epitaxial layer 14 in the peripheral region 18, and a P-type doped region 28 is disposed in the N-type epitaxial layer 14 under the field oxide layer 26 for reduce the breakdown voltage. An anode 30 formed on the N-type epitaxial layer 14 extends onto the field oxide layer 26 to change a depletion region between the P-type doped region 28 and the N-type epitaxial layer 14, so that high electric field in the active region 16 can be reduced.

Refer to FIG. 2, which is a schematic diagram illustrating a guard ring structure according to the prior art. As shown in FIG. 2, a plurality of P-type doped regions 52, each of which is a ring structure, are disposed in the N-type epitaxial layer 50, and surround the outside of the active region in sequence. The power semiconductor device of the prior art can utilize the depletion region formed by each P-type doped region 52 and the N-type epitaxial layer 50 to reduce the strength of the electric field.

However, the termination structure of the prior art in size generally requires a width of over 20 micrometers to efficiently reduce the high electric field, so that the size of the power semiconductor device is limited by the width of the termination structure with shrinking the size of the devices. Furthermore, the process of forming the termination structure of the prior art require extra step to form P-type doped region in the N-type epitaxial layer for reduce the high electric field of the power semiconductor device through the depletion region, but the process of fabricating the termination structure of the prior art need a photomask to perform a P-type ion implantation process, so that the manufacturing cost cannot be further reduced.

Accordingly, it is still needed for a novel termination structure of a power semiconductor device and a novel manufacturing method thereof to shrink the termination structure of the power semiconductor device and reduce the number of the photomasks.

SUMMARY OF THE INVENTION

An object of the present invention is to provide a termination structure of a power semiconductor device and a manufacturing method of the power semiconductor device to shrink the termination structure of the power semiconductor device and reduce the number of the photomasks.

According to an embodiment of the present invention, a termination structure of a power semiconductor device is provided. The power semiconductor has an active region and a termination region, and the termination region surrounds the active region. The termination structure is disposed in the termination region, and the termination structure comprises a semiconductor substrate, an insulating layer, and a metal layer. The semiconductor substrate has a first conductive type and a trench disposed in the termination region. The insulating layer is partially filled into the trench and covers the semiconductor substrate, and a top surface of the insulating layer has a hole. The metal layer is disposed on the insulating layer and is filled into the hole.

According to an embodiment of the present invention, a termination structure of a power semiconductor device is provided. The power semiconductor having an active region and a termination region, and the termination region surrounds the active region. The termination structure is disposed in the termination region, and the termination structure comprises a semiconductor substrate having a conductive type and a trench, an insulating layer covering the semiconductor substrate, and a metal layer disposed on the insulating layer. The trench is filled up with the insulating layer, and the metal layer comprises a contact plug penetrating through the insulating layer.

According to an embodiment of the present invention, a termination structure of a power semiconductor device is provided. The power semiconductor has an active region and a termination region, and the termination region surrounds the active region. The termination structure is disposed in the termination region, and the termination structure comprises a semiconductor substrate having a conductive type and a trench, and an insulating layer covering the semiconductor substrate. The trench is filled up with the insulating layer.

According to an embodiment of the present invention, a manufacturing method of a power semiconductor device is provided. First, a semiconductor substrate is provided, and the semiconductor substrate has at least one first trench and a second trench. The semiconductor substrate has an active region and a termination region, and the first trench is disposed in the active region. The second trench is disposed in the termination region, and the semiconductor substrate has a first conductive type. Next, a gate structure is formed in the first trench, wherein the gate structure comprises a first insulating layer and a gate conductive layer. Then, the semiconductor substrate is covered with a second insulating layer, and the first trench is filled up with the second insulating layer. The second insulating layer is filled into the second trench. After, the first insulating layer and the second insulating layer outside the first trench and the second trench are removed to expose a part of the semiconductor substrate. Subsequently, a doped body region and a doped source region are formed in the exposed semiconductor substrate, wherein the doped body region has a second conductive type, and the doped source region is disposed in the doped body region and has the first conductive type. Next, the semiconductor substrate is covered with an interlayer dielectric layer. Then, a source metal layer and a gate metal layer is formed on the interlayer dielectric layer, so that the source metal layer is electrically connected to the doped source region, and the gate metal layer is electrically connected to the gate conductive layer.

The manufacturing method of the power semiconductor device in the present invention only requires three photomask to complete the power semiconductor device, so that the number of the photomask can be effectively reduced, and the formed trench of the termination structure only has the width that is between 2 micrometers and 20 micrometers, so that the size of the power semiconductor device 100 can be effectively reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
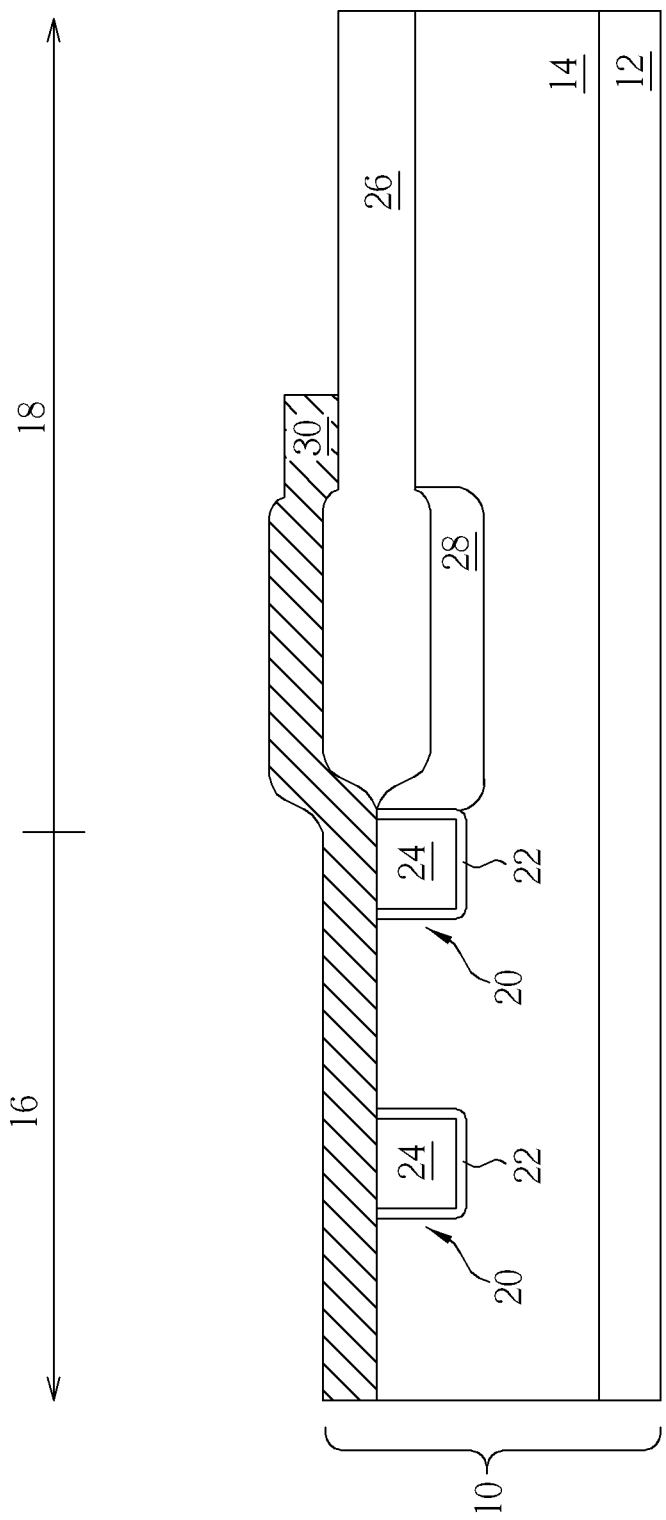
FIG. 1 is a schematic diagram illustrating a power semiconductor device utilizing a field oxide layer to be a termination structure according to the prior art.
Figure 2:
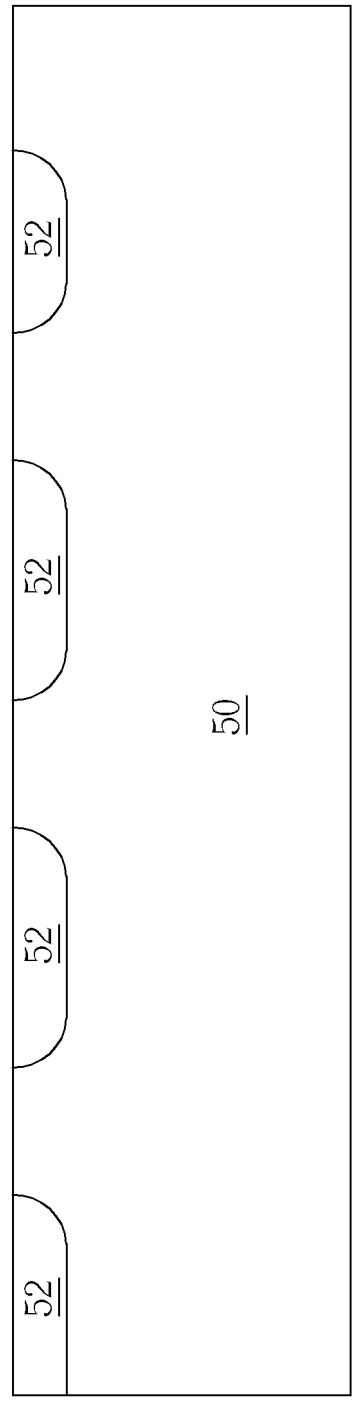
FIG. 2 is a schematic diagram illustrating a guard ring structure according to the prior art.
Figure 3:
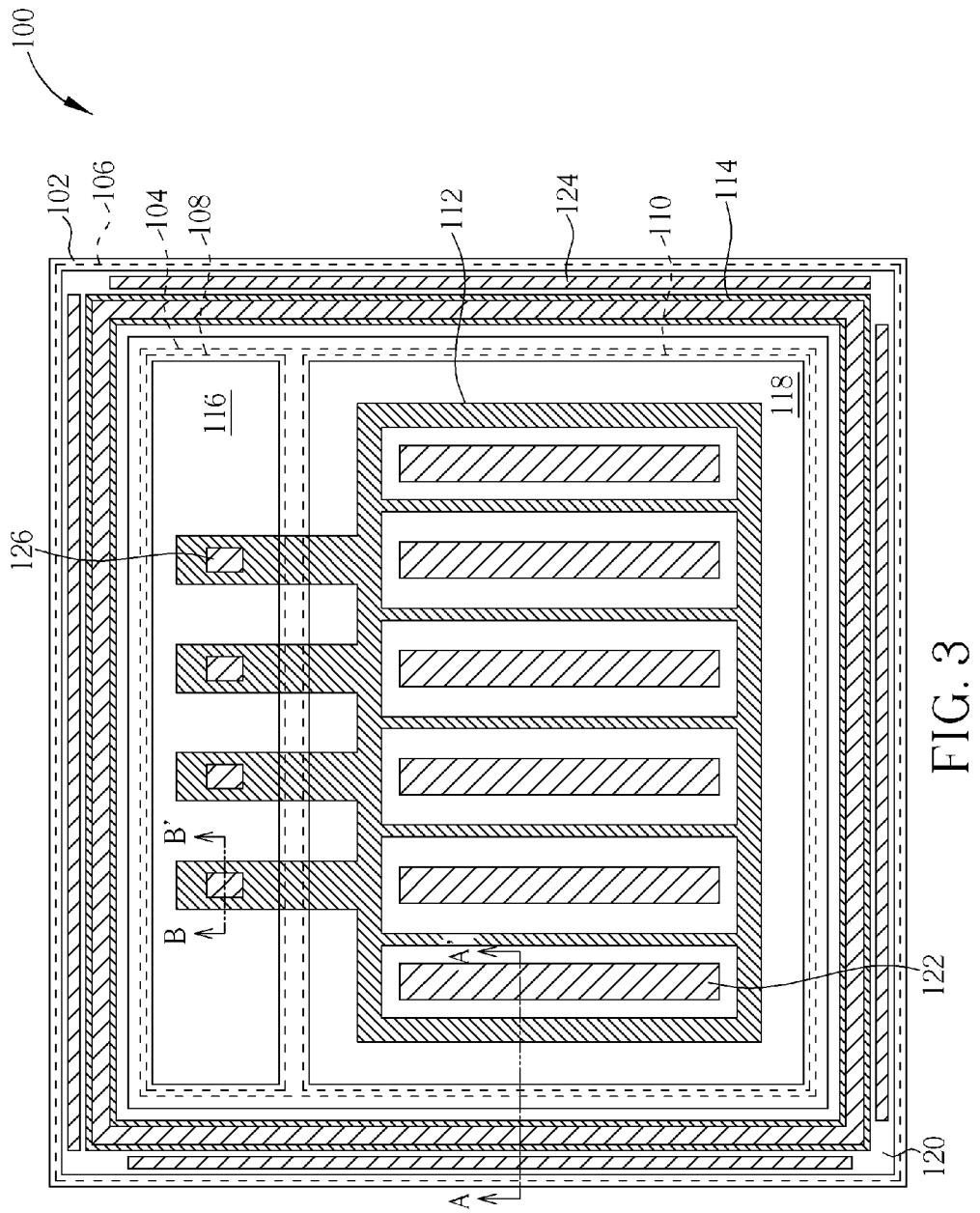
FIG. 3 is a schematic diagram illustrating a top view of a power semiconductor device according to a first embodiment of the present invention.

Refer to FIG. 3, which is a schematic diagram illustrating a top view of a power semiconductor device according to a first embodiment of the present invention. As shown in FIG. 3, the power semiconductor device 100 of this embodiment includes a semiconductor substrate 102, and the semiconductor substrate 102 has an active region 104 and a termination region 106. The termination region 106 surrounds the active region 104, and the active region 104 includes a first region 108 and a second region 110. In addition, the semiconductor substrate 102 has a first trench 112 and a second trench 114 surrounding the first trench 112. Also, the first trench 112 is disposed in the active region 104 and extends from the first region 108 to the second region 110, and the second trench 114 is disposed in the termination region 106. Furthermore, the first trench 112 is used to be a cell trench for being filled with the gate structure, and the second trench 114 is used to be a termination trench for being filled with a termination structure. Moreover, a gate metal layer 116 and a source metal layer 118 are disposed on the semiconductor substrate 2 in the active region 104. The gate metal layer 116 is disposed in the first region 108, and the source metal layer 118 is disposed in the second region 110, so that the gate metal layer 116 and the source metal layer 118 can overlap the first trench 112. Furthermore, a drain metal layer 120 is disposed on the semiconductor substrate 102 in the termination region 106, and the drain metal layer 120 overlaps the second trench 114 and surrounds the gate metal layer 116 and the source metal layer 118. A plurality of first contact plugs 122 is disposed on the semiconductor substrate 102 in the second region 110, and a second contact plug 124 is disposed on the semiconductor substrate 102 in the termination region 106 and used to electrically connect the drain metal layer 120 to the semiconductor substrate 102. In addition, a plurality of third contact plugs 126 are disposed on the first trench 112 in the first region 108 and used to electrically connect the gate metal layer 116 to the gate structure. It should be noted that a width of the second trench 114 is larger than a width of the first trench 112. For example, the width of the second trench 114 is substantially 5 to 20 times as large as the width of the first trench 112. In this embodiment, the width of the second trench 114 is substantially between 2 micrometers and 20 micrometers, and the width of the first trench 112 in the second region 110 is substantially between 0.18 micrometers and 0.8 micrometers. In addition, the width of the first trench 112 in the first region 108 is larger than the width of the first trench in the second region 110, and is substantially between 0.6 micrometers and 1.2 micrometers, but is not limited to this. In other embodiments of the present invention, the width of the first trench 112 in the first region 108 also can be the same as the width of the first trench 112 in the second region 110, and is not limited to this.

Figure 4:
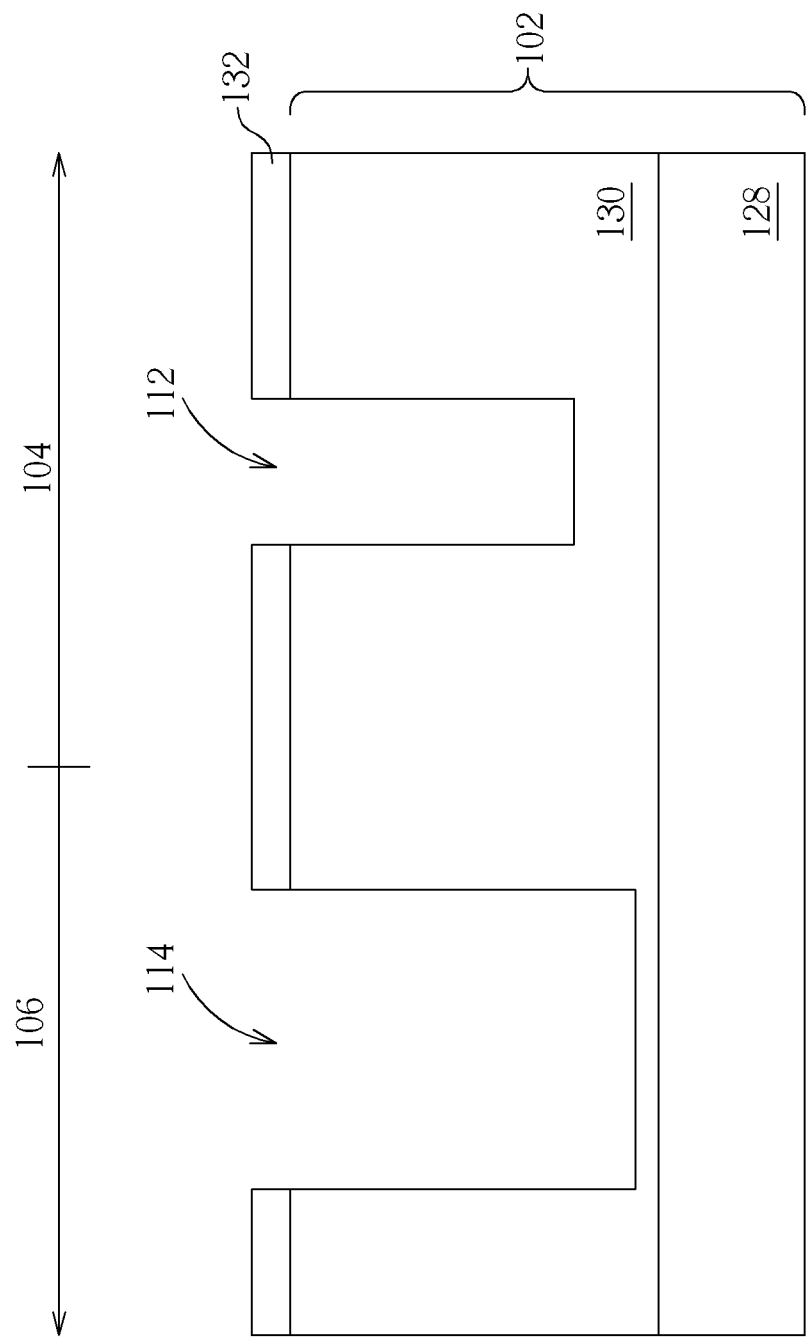
FIG. 4 through FIG. 12 are schematic diagrams illustrating a manufacturing method of the power semiconductor device according to the first embodiment of the present invention.

Refer to FIG. 4 through FIG. 12, which are schematic diagrams illustrating a manufacturing method of the power semiconductor device according to the first embodiment of the present invention. FIG. 4 through FIG. 12 schematically illustrate cross-sectional views of the power semiconductor device shown in FIG. 3 along a cutting line A-A' in different manufacturing steps. As shown in FIG. 4, the semiconductor substrate 102 is first provided. The semiconductor substrate 102 includes a substrate 128 and an epitaxial layer 130, and the semiconductor substrate 102 has a first conductive type. In this embodiment, the first conductive type is N type, but is not limited herein. Then, a first photomask is utilized to form a patterned photoresist layer 132 on the N-type epitaxial layer 130 to serve as a hard mask. A material of the patterned photoresist layer 132 can be oxide, a stack of oxide and nitride or other materials capable of serving as the hard mask. After, the patterned photoresist layer 132 is utilized as a mask to etch the N-type epitaxial layer 130, so that the first trench 112 and the second trench 114 can be formed on the N-type epitaxial layer 130. Please note that the width of the second trench 114 is larger than the width of the first trench 112, so that a rate of etching the second trench 114 is faster than a rate of etching the first trench 112. Thus, a depth of the second trench 114 is deeper than a depth of the first trench 112, and the first trench 112 and the second trench 114 in this embodiment are not in contact with the N-type substrate 128. The present invention is not limited to this, and the depth of the second trench 114 in the present invention also can be in contact with the N-type substrate 128 and expose the N-type substrate 128, and the first trench 112 is still not in contact with the N-type substrate 128. Clearly speaking, the etching time or other parameters in the present invention can be adjusted to have a specific etching depth. Thus, according to the condition of the rate of etching second trench 114 being faster than the rate of etching the first trench 112, the second trench 114 can penetrate through the N-type epitaxial layer 130 and extend into the N-type substrate when the first trench 112 is not in contact with the N-type substrate 128.

Figure 5:
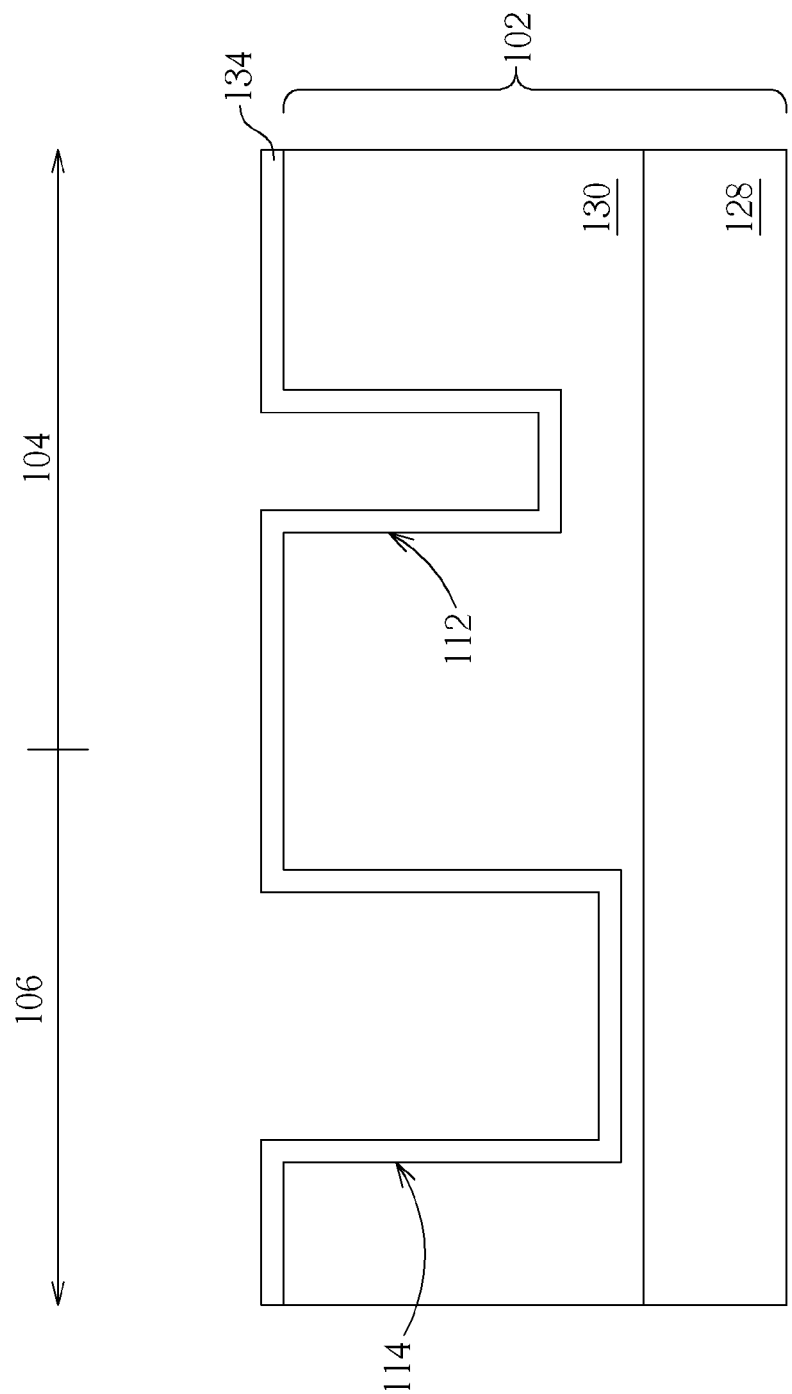

As shown in FIG. 5, the patterned photoresist layer 132 is then removed, and a first insulating layer 134 is completely formed on the N-type epitaxial layer 130. The first insulating layer 134 covers surfaces of the first trench 112 and the second trench 114. A material of the first insulating layer can be an insulating material, such as oxide or nitride, etc., and the process of forming the first insulating layer 134 can be thermal oxidation process, chemical vapor deposition (CVD) process or high density plasma (HDP) CVD process, but is not limited herein. In this embodiment, before forming the first insulating layer 134, a surface treatment process, such as rapid thermal annealing process, can be selectively performed on the N-type epitaxial layer 130 so that the N-type epitaxial layer 130 at corners can be smoothened. Therefore, the first insulating layer 134 formed on the N-type epitaxial layer 130 and the gate conductive layer 138 formed after can be prevented from having sharp structure, and breakdown voltage of the first insulating layer 134 at the corners can be raised. In this embodiment, a thickness of the first insulating layer 134 can be substantially between 0.1 micrometers and 3 micrometers.

Figure 6:
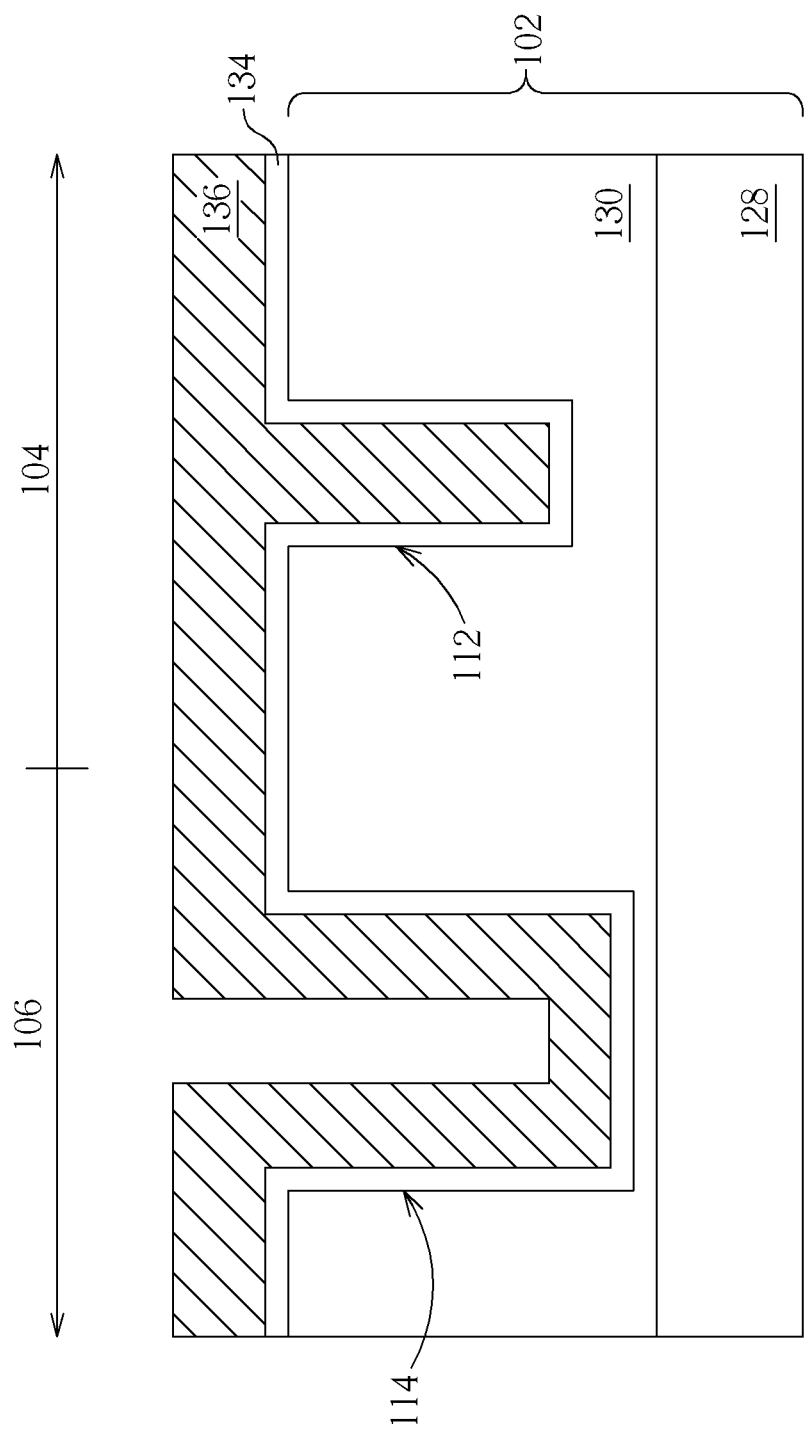

As shown in FIG. 6, a deposition process is then performed to form a conductive layer 136 to cover the first insulating layer 134. The first trench 112 is filled up with the conductive layer 136, and the conductive layer 136 is partially filled into the second trench 114. It should be noted that, due to the difference of the widths between the first trench 112 and the second trench 114, the effect of the first trench 112 being filled up and the second trench 114 being partially filled can be achieved without using extra photomask. In this embodiment, a material of the conductive layer 136 can be a conductive material, such as polysilicon, etc. In other embodiments of the present invention, phosphine also can be selectively in-situ injected during performing the deposition process, so that the formed conductive layer can have low resistance. Furthermore, in other embodiments of the present invention, an ion implantation process and an annealing process also can be selectively performed to lower the resistance of the conductive layer after the deposition process. Or, phosphorus oxychloride ($POCl_3$) can be injected to lower the resistance of the conductive layer 136 after the deposition process.

Figure 7:
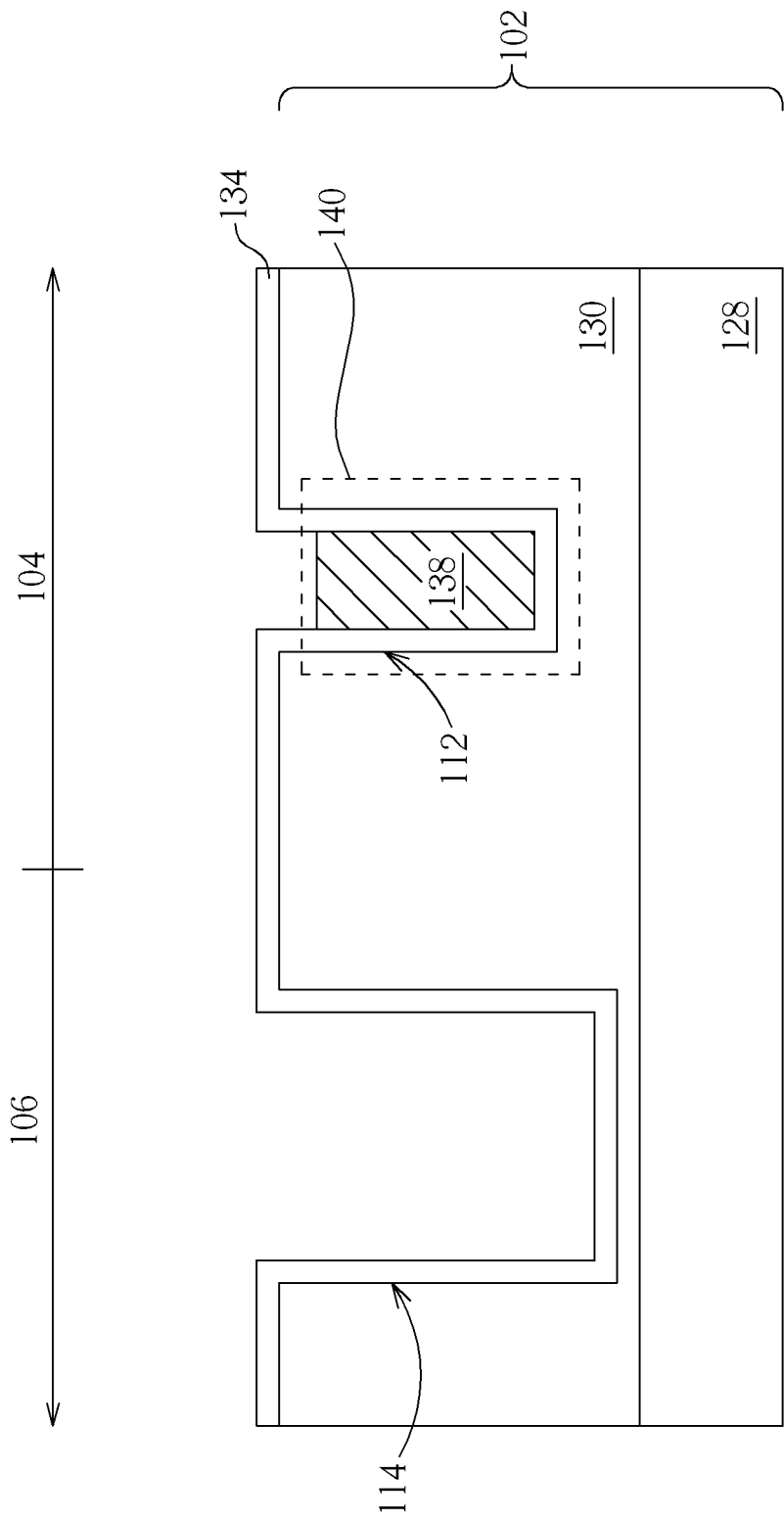

As shown in FIG. 7, next, an isotropic etching process is completely performed on the conductive layer 136 to remove the conductive layer 136 outside the first trench 112 and the second trench 114 and simultaneously remove the conductive layer 136 in the second trench 114, so that only the gate conductive layer 138 is formed in the first trench 112. The gate conductive layer 138 serves as a gate of the power semiconductor device 100, and the gate conductive layer 138 and the first insulating layer 134 in the first trench 112 constitute a gate structure 140. In this embodiment, an etching material having high etching selectivity for etching polysilicon relative to oxide, such as mixture of chlorine and fluorine or plasma made of fluorine, can be used in the isotropic etching process to remove the conductive layer 136 made of polysilicon, and the first insulating layer 134 can remain. The present invention is not limited to the above etching material. In other embodiments of the present invention, the isotropic etching process of the present invention also can have high etching selectivity for etching polysilicon relative to oxide through adjusting process parameters. It should be noted that the structure of the conductive layer 136 in the first trench 112 being removed and a part of the conductive layer 136 remaining can be fabricated in the same etching process without using extra photomasks in the present invention. Furthermore, an oxidation process can be selectively performed after etching the conductive layer 136 to completely oxidize the remaining conductive layer 136 in the second trench 114 in the present invention.

Figure 8:
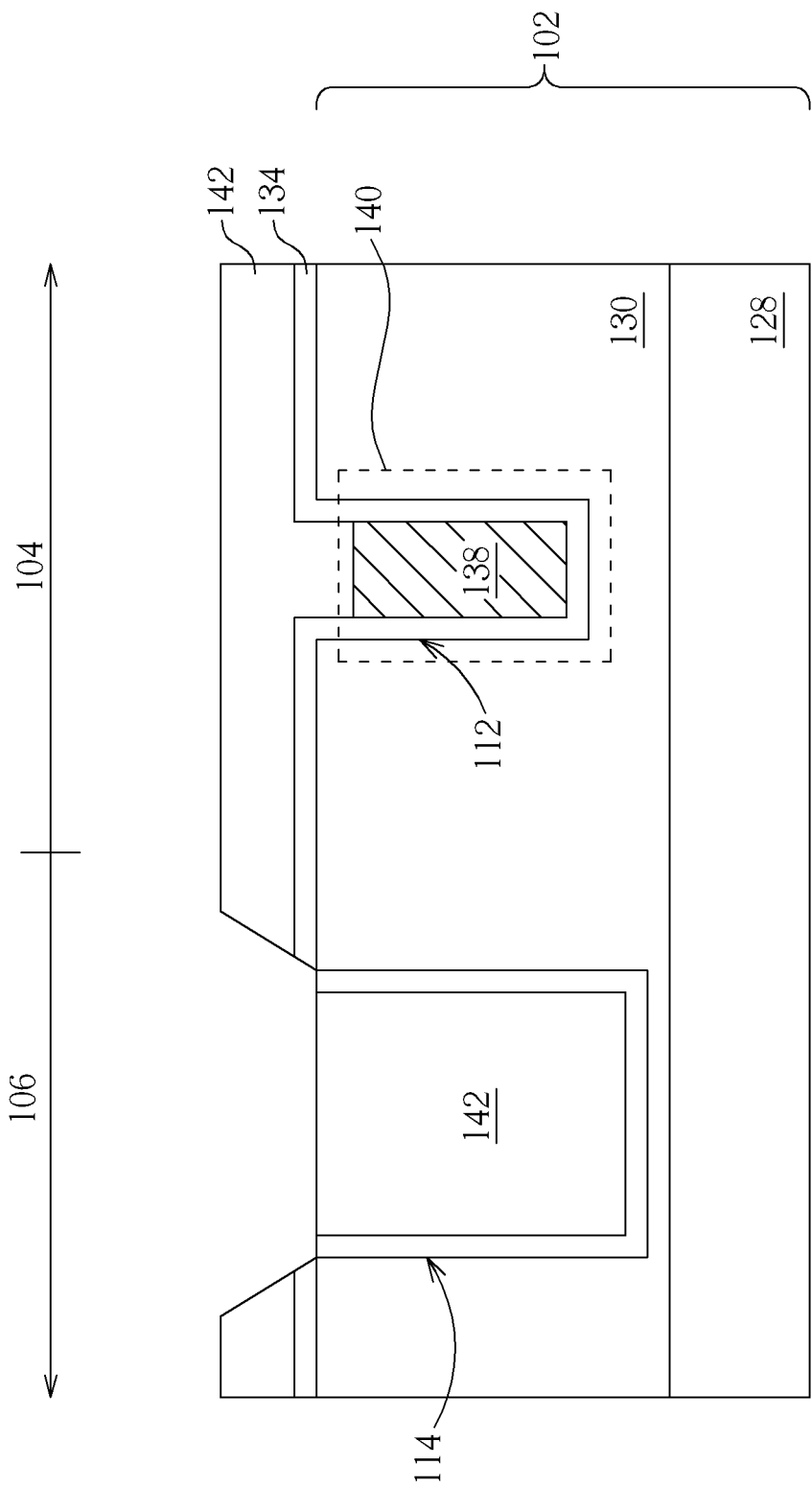
Figure 13:
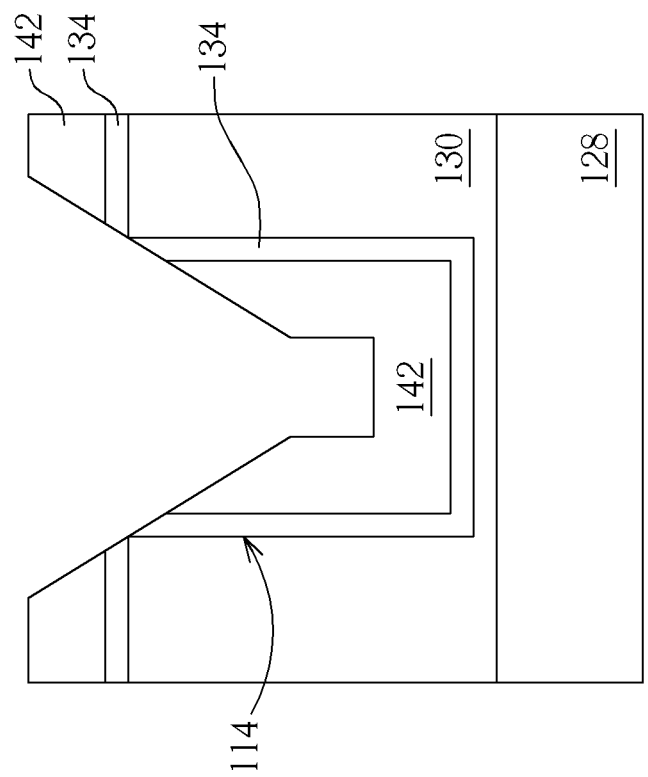
FIG. 13 through FIG. 15 show other examples of the profiles of the second insulating layer in the second trench of the power semiconductor device according to the first embodiment of the present invention.
Figure 14:
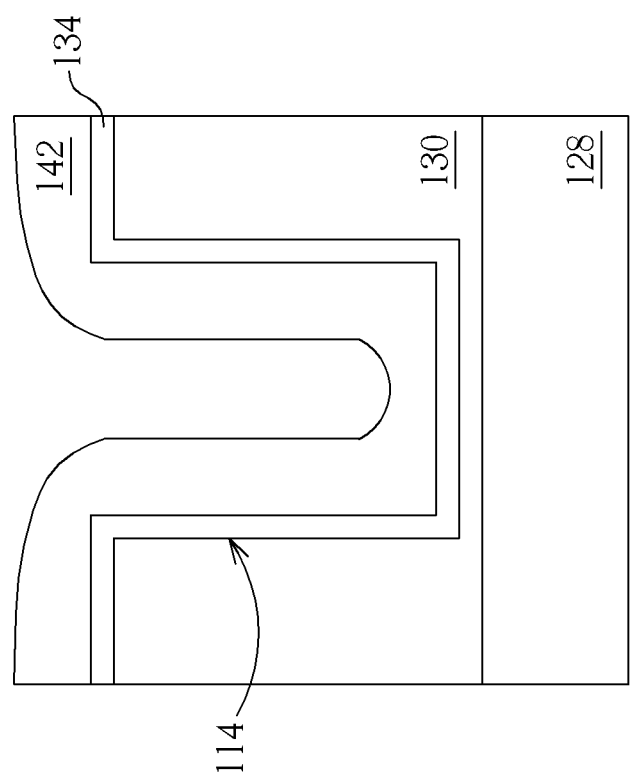
Figure 15:
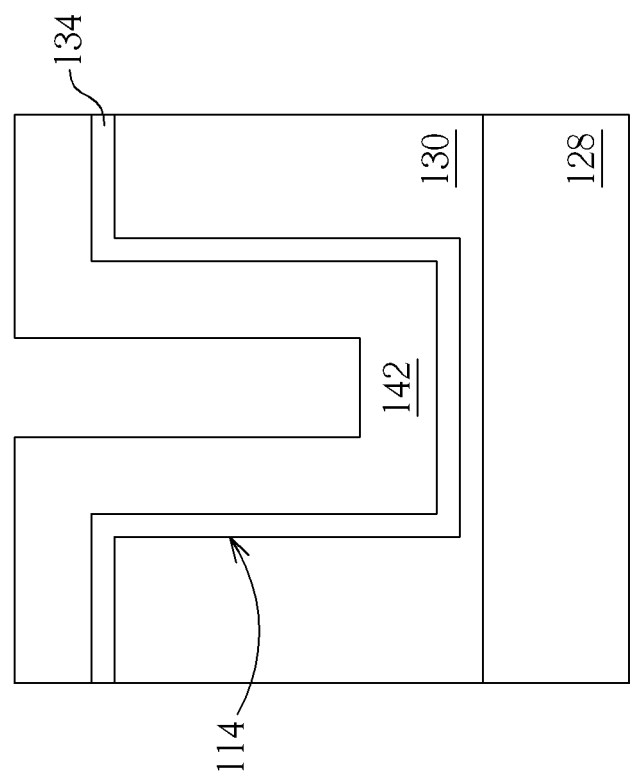

As shown in FIG. 8, a second insulating layer 142 is then formed on the first insulating layer 134 and the gate conductive layer 138, and the first trench 112 and the second trench 114 are filled up with the second insulating layer 142. In this embodiment, a high density plasma (HDP) chemical vapor deposition (CVD) process can be used to form the second insulating layer 142. The present invention is not limited to use the HDP CVD process, and can use the CVD process to form the second insulating layer 142. In addition, the second insulating layer 142 can be made of oxide, borophosphosilicate glass (BPSG), a combination of oxide and BPSG, tetraethyl-ortho-silicate (TEOS) or a combination of HDP oxide and TEOS. Please note that the second insulating layer 142 filled into the second trench 114 can have different profile through using different material to form the second insulating layer 142, and the second trench 114 of the present invention is not limited to completely filled up with the second insulating layer 142. Refer to FIG. 13 through FIG. 15, which show other examples of the profiles of the second insulating layer 142 in the second trench 114 of the power semiconductor device according to the first embodiment of the present invention. As shown in FIG. 13, the second trench 114 can only be partially filled with the second insulating layer 142. As shown in FIG. 14, the second insulating layer 142 can have a smooth surface when the second insulating layer 142 of the present invention is made of BPSG, and the second insulating layer 142 is heated to flow and fill into the second trench 14 during forming the second insulating layer 142. As shown in FIG. 15, the second insulating layer 142 can have a uniform thickness when the second insulating layer 142 is made of TEOS or the combination of HDP oxide and TEOS.

Figure 9:
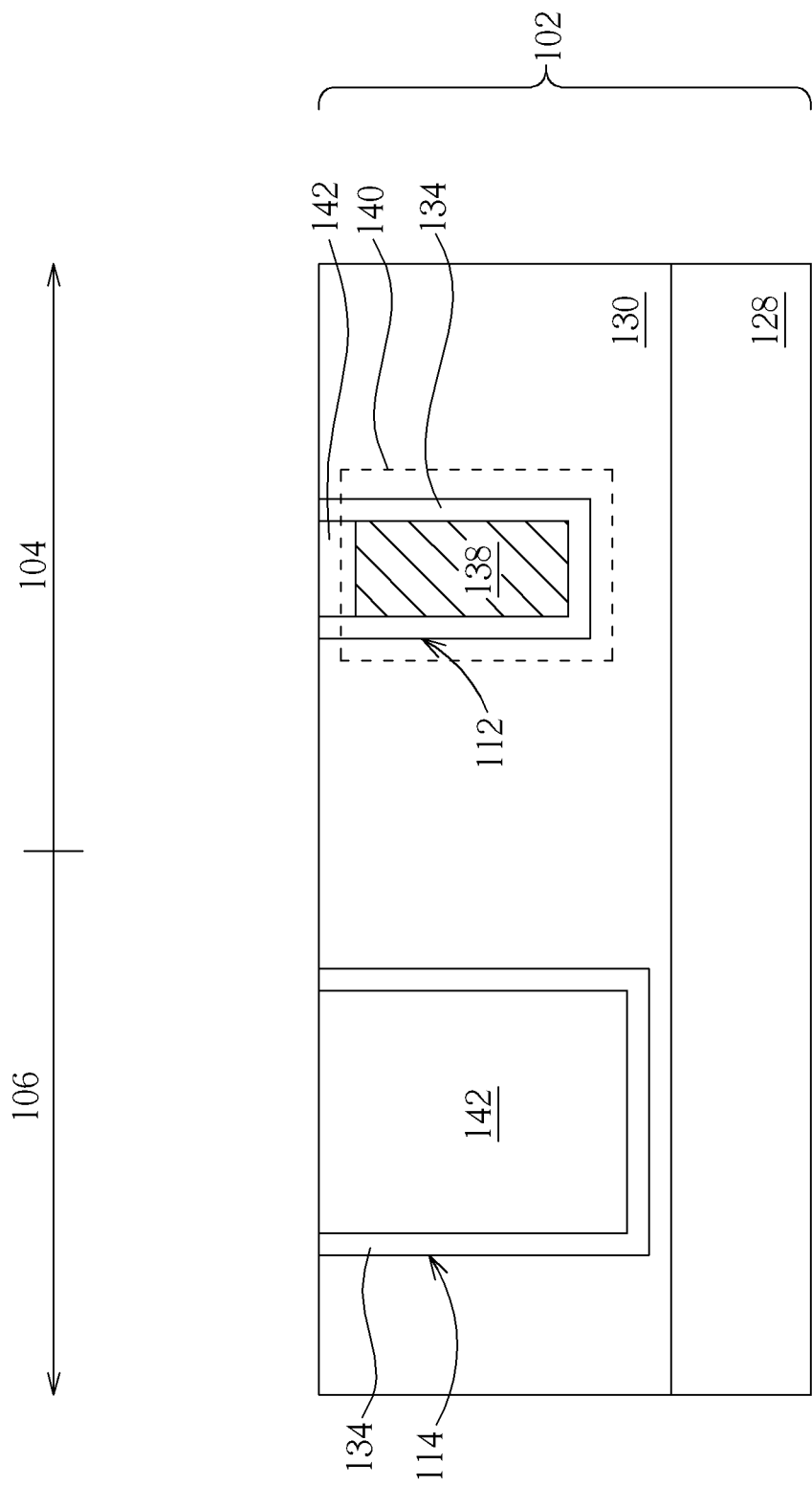

As shown in FIG. 9, next, a chemical mechanical polishing (CMP) process is performed to remove the first insulating layer 134 and the second insulating layer 142 outside the first trench 112 and the second trench 114, so that a part of the N-type epitaxial layer 130 is exposed, and the first insulating layer 134 and the second insulating layer 142 in the first trench 112 and the second trench 114 remain. The present invention is not limited to using the CMP process, and a photolithography and etching process also can be used to remove the first insulating layer 134 and the second insulating layer 142 outside the first trench 112 and the second trench 114. The present invention is not limited herein.

Figure 10:
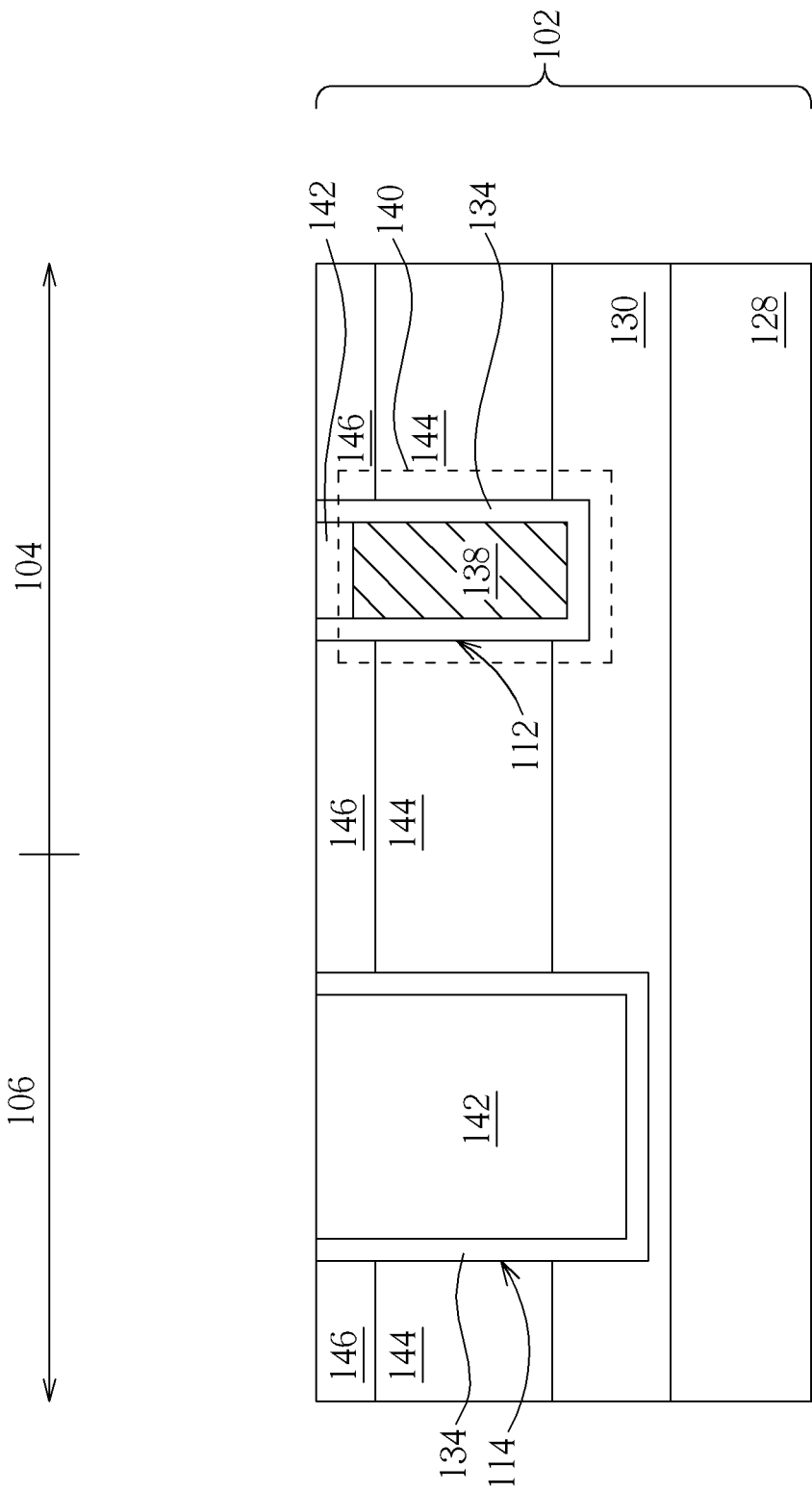

As shown in FIG. 10, a doped body region 144 and a doped source region 146 disposed in the doped body region 114 are formed in the exposed N-type epitaxial layer 130, and the doped body region 144 has a second conductive type opposite to the first conductive type. The doped source region 146 has the first conductive type and serves as a source of the power semiconductor device 100. The N-type epitaxial layer 130 under the doped body region 144 serves as a drain of the power semiconductor device 100. In this embodiment, the second conductive type is P type, but the present invention is not herein. Furthermore, the method for forming the P-type doped body region 144 and the N-type doped source region 146 in this embodiment is described in the following description. First, two ion implantation processes are respectively performed to implant P-type ions and N-type ions into the N-type epitaxial layer 130, and then a thermal drive-in process is performed to drive the P-type ions and the N-type ions, so that the formed P-type doped body region 144 and N-type doped source region 146 can reach a predetermined position, and the N-type doped source region 146 is disposed on the P-type doped body region 144. The method for forming the P-type doped body region 144 and the N-type doped source region 146 of the present invention is not limited to this. The P-type doped body region 144 and the N-type doped source region 146 also can be formed separately. That is, the thermal drive-in process is performed after the P-type ion implantation process. Then, the N-type ion implantation process is performed, and another thermal drive-in process is performed thereafter. It should be noted that the P-type doped body region 144 and the N-type doped source region 146 can be completely formed in the N-type epitaxial layer 130 without using extra photomask. In the other embodiments of the present invention, a photolithography and etching process also can be used to fabricate a photoresist layer as a mask to implant the P-type ions and the N-type ions, but the present invention is not limited herein.

Figure 11:
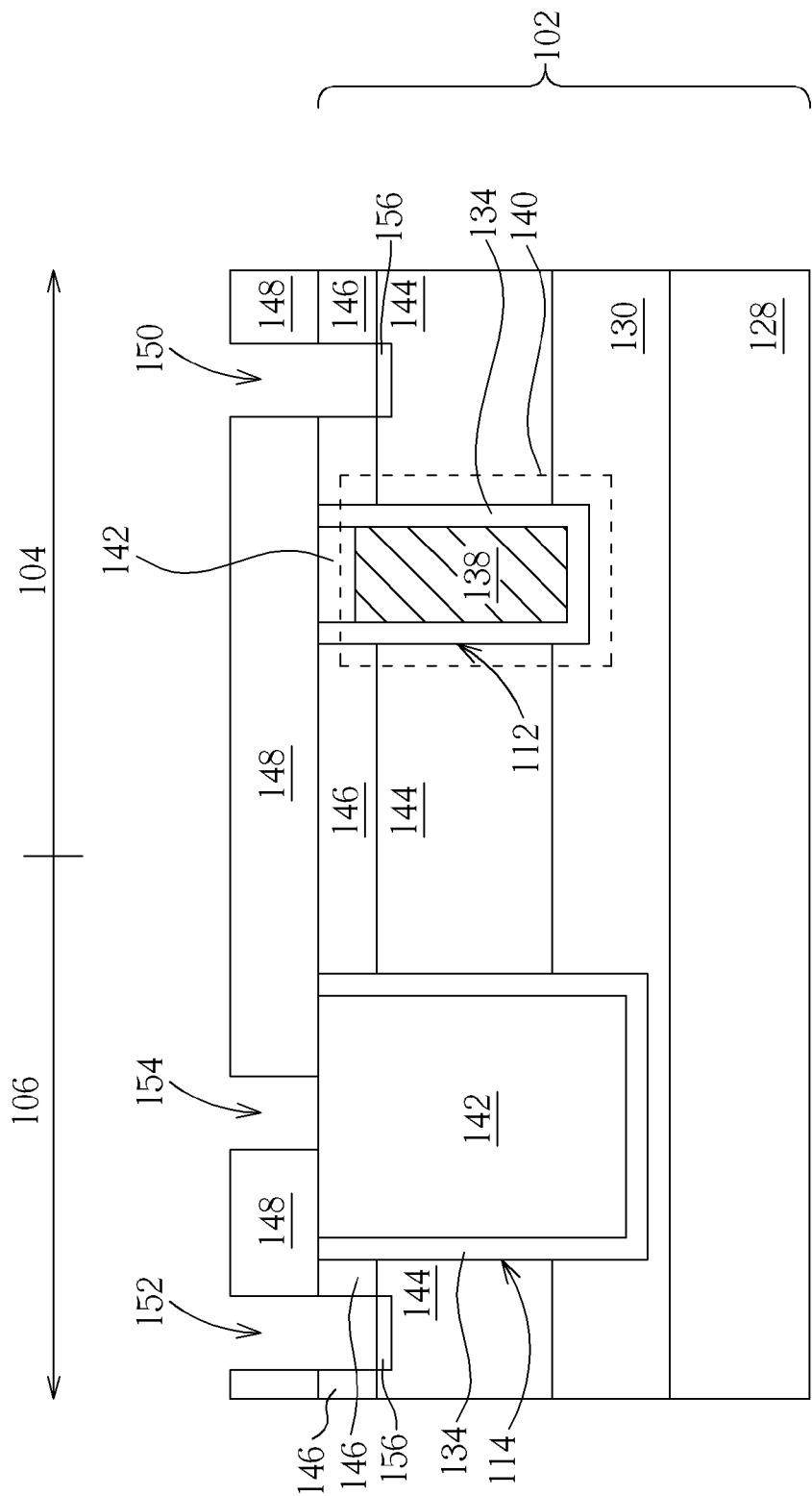

As shown in FIG. 11, an interlayer dielectric layer 148 is subsequently formed to completely cover the N-type epitaxial layer 130. In this embodiment, a HDP chemical vapor deposition (CVD) deposition process or a CVD deposition process can be used to form the interlayer dielectric layer 148, and the interlayer dielectric layer 148 can be made of oxide, BPSG, a combination of oxide and BPSG or other insulating materials. Thereafter, a second photomask is used to form at least one first contact hole 150 in the interlayer dielectric layer 148, the second insulating layer 142 and the N-type doped source region 146 in the first region 108, a second contact hole 152 in the interlayer dielectric layer 148, the second insulating layer 142 and the N-type doped source region 146 in the termination region 106, at least one third contact hole (not shown in FIG. 11) in the interlayer dielectric layer 148 and the second insulating layer 142 in the second region 110, and a hole 154 in the interlayer dielectric layer 148 on the second trench 114. The first contact hole 150 and the second contact hole 152 expose the N-type doped source region 146 and the P-type doped body region 144, and the third contact hole exposes the gate conductive layer 138. Then, a P-type ion implantation process is performed to form a doped contact region 156 in each part of the exposed P-type doped body region 144, and the doped contact region 156 has the second conductive type. Please note that the step of forming the first contact hole 150, the second contact hole 152, the third contact hole and the hole 154 in this embodiment can include forming a patterned photoresist layer by using the second photomask, and then performing an etching process for etching oxide in combination with an etching material having high selectivity for etching oxide relative to silicon. Thus, only the interlayer dielectric layer 148 made of oxide is etched, and the etching process would be slowed down for etching N-type doped source region when the N-type doped source region 146 is exposed. At the same time, the hole 154 is formed, and a bottom of the hole has the same height as the surface of the N-type doped source region 146. The step of first contact hole 150, the second contact hole 152, the third contact hole and the hole 154 in the present invention do not limited to be formed by using the etching material having high selectivity for etching oxide relative to silicon. In other embodiments of the present invention, the etching material without high selectivity for etching oxide relative to silicon can be used to form the hole 154 having the bottom that is substantially lower than the surface of the N-type doped source region 146, and the first contact hole 150 and second contact hole 152 do not expose the P-type doped body region 144. Next, the etching process for silicon is performed to only etch the N-type doped source region 146 made of silicon, so that the first contact hole 150, the second contact hole 152 and the third contact hole can be formed, and the P-type doped body region 144 is exposed. Thus, a bottom of the hole 154 is disposed on an interface between the P-type doped body region 144 and the N-type doped source region 146.

In other embodiments of the present invention, the interlayer dielectric layer 148 can be selectively heated to flow and fill up the second trench 114 after forming the interlayer dielectric layer 148, and the interlayer dielectric layer 148 can have a smoother surface, but is not limited herein. The second trench 114 of the present invention also can be partially filled with the interlayer dielectric layer 114.

Figure 12:
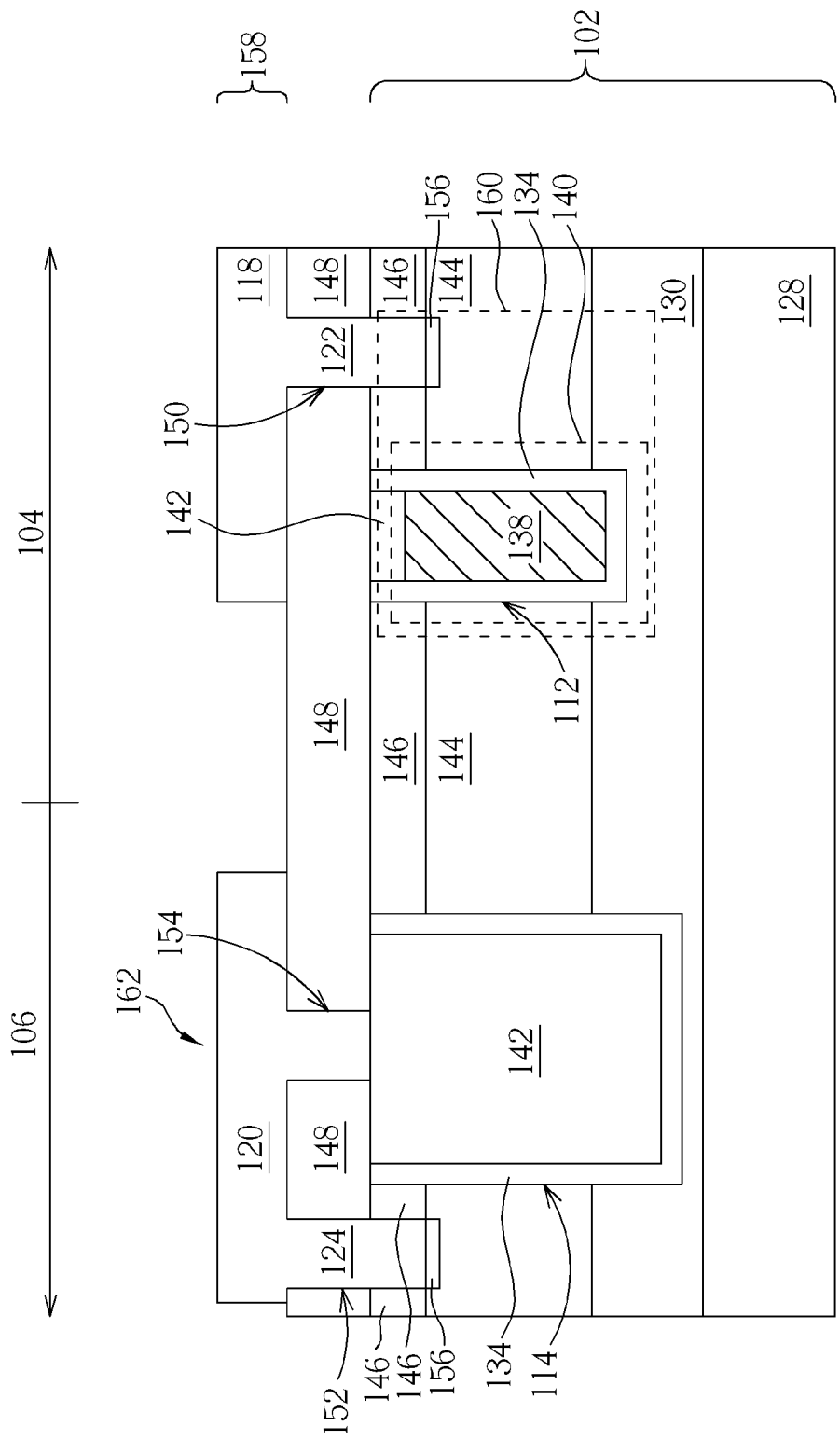

As shown in FIG. 12, a metal layer (not shown in figures) is formed after. Then, a third photomask is used to perform a photolithography and etching process to form a patterned metal layer 158 on the interlayer dielectric layer 148. The patterned metal layer 158 can be made of titanium (Ti), titanium nitride (TiN), Tungsten (W), aluminum-silicon alloy or aluminum-silicon-copper alloy, etc., but is not limited to this. The patterned metal layer 158 includes a source metal layer 118, a gate metal layer 116 and a drain metal layer 120, and the first contact hole 150, the second contact hole 152, the third contact hole and the hole 154 are filled up with the patterned metal layer 158. The first contact hole 150 is filled up with the source metal layer 118, so that the first contact plug 122 is formed in the first contact hole 150. The second contact hole 152 and the hole 154 are filled up with the drain metal layer 120, so that the second contact plug 124 is formed in the second contact hole 152. The third contact hole is filled up with the gate metal layer 116, so that the third contact plug 126 is formed in the third contact hole. The first contact plug 122 electrically connects the source metal layer 118 and the N-type doped source region 146. The second contact plug 124 electrically connects the drain metal layer 120 and the N-type epitaxial layer 130 serving as the drain of the power semiconductor device 100. The third contact plug 126 electrically connects the gate metal layer 116 and the gate conductive layer 138. Therefore, the power semiconductor device 100 is completed. It should be noted that the power semiconductor device 100 is completed by only using three photomasks in this embodiment, so that the number of the photomask can be effectively reduced, and the manufacturing cost can be decreased.

Figure 16:
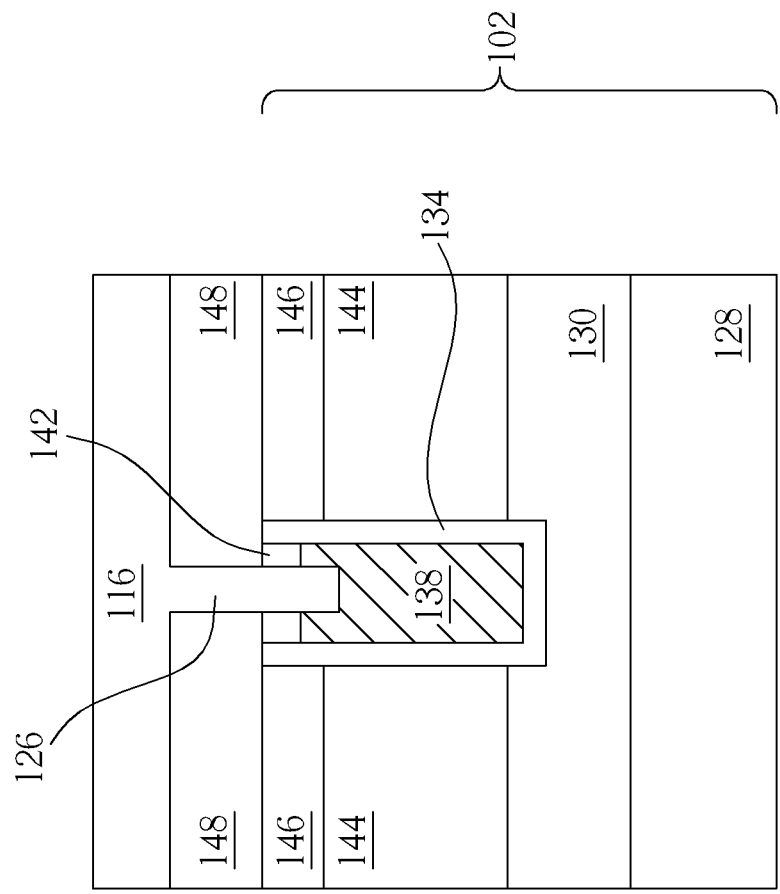
FIG. 16 is a schematic diagram illustrating a cross section of FIG. 3 along a cutting line B-B'.

For clearly describe the structure of the power semiconductor device in this embodiment, refer to FIG. 16 together with FIG. 3 and FIG. 12. FIG. 16 is a schematic diagram illustrating a cross section of FIG. 3 along a cutting line B-B', and FIG. 12 is a schematic diagram illustrating a cross section of FIG. 3 along a cutting line A-A'. As shown in FIG. 3, FIG. 12 and FIG. 16, the power semiconductor device 100 includes at least one transistor device 160 and a termination structure 162. The transistor device 160 can be constituted by the gate structure 140, the P-type doped body region 144, the N-type doped source region 146 and the N-type epitaxial layer 130 in the second region 110. In addition, the N-type doped source region 146 is electrically connected to the source metal layer 118 through the first contact plug 122. Also, the gate conductive layer 138 extends into the first region 108 through the first trench 112, and is electrically connected to the gate metal layer 116 through the third contact plug 126. In this embodiment, the termination structure 162 is disposed in the termination region 106, and surrounds the transistor device 160. The termination structure 162 includes the semiconductor substrate 102 having the second trench 114, an insulating layer and a metal layer. The insulating layer is constituted by the first insulating layer 134, the second insulating layer 142 and the interlayer dielectric layer 148. The second trench 114 is partially filled with the insulating layer, and the insulating layer covers the semiconductor substrate 102. Furthermore, the surface of the insulating layer has the hole 154 that is filled up with the metal layer disposed on the insulating layer. The metal layer in this embodiment is drain metal layer 120, and is further electrically connected to the P-type doped body region 144 in the termination region 106. Accordingly, high electric field generated from the transistor device 160 disposed at the inside of the second trench 114 can be prevented from penetrating through the second trench 114 to the outside of the second trench 114 by filling the insulating layer into the second trench 114 and disposing the drain metal layer 120 on the insulating layer. Please note that although the depletion region formed between the N-type epitaxial layer 130 and the P-type doped body region 144 generates high electric field, the second trench 114 in this embodiment only requires a width that is between 2 micrometers and 20 micrometers to insulate the high electric field of the depletion region from penetrating to the outside of the second trench 114, so that the voltage breakdown can be avoided, and the size of the power semiconductor device 100 can be effectively reduced.

Figure 17:
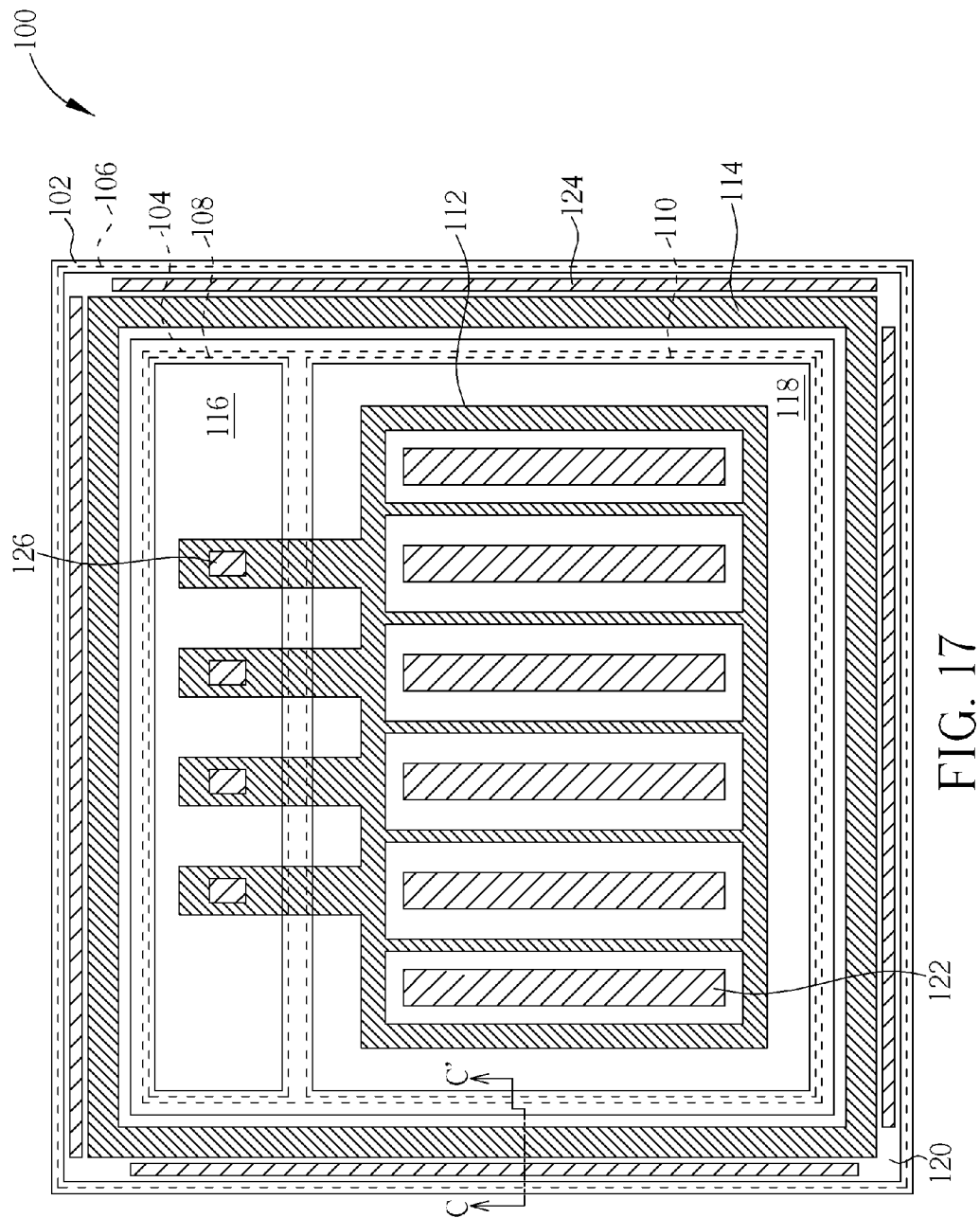
FIG. 17 is a schematic diagram illustrating a top view of a power semiconductor device according to a second embodiment of the present invention.
Figure 18:
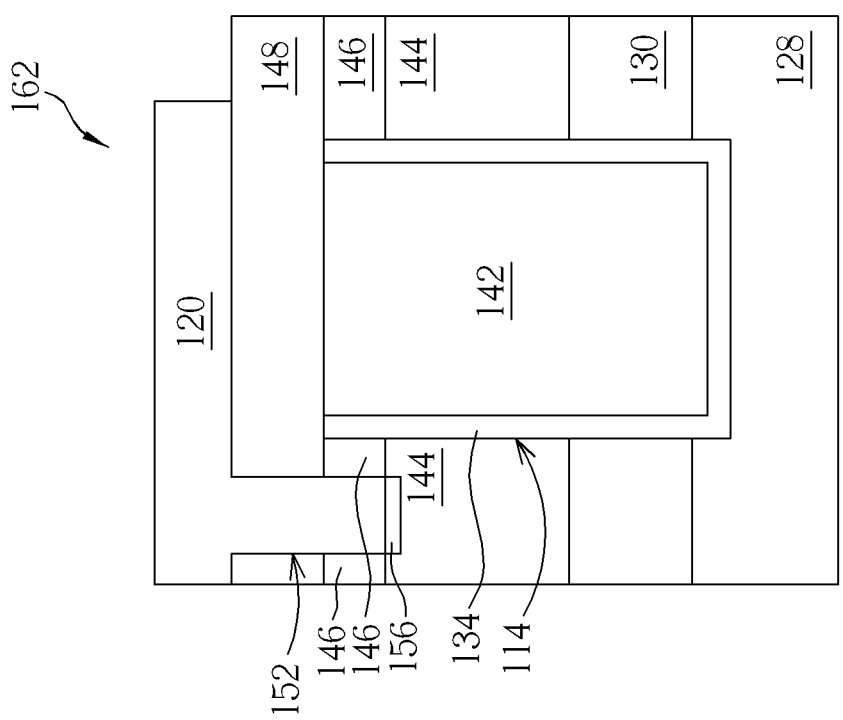
FIG. 18 is a schematic diagram illustrating a cross section of FIG. 17 along a cutting line C-C'.

The termination structure of the power semiconductor device in the present invention is not limited to the structure in the first embodiment. The following description will detail the difference between the other embodiments and the first embodiment. The same numerals denote the same components in the other embodiments or modifications, and the same parts are not detailed redundantly. Refer to FIG. 17 and FIG. 18. FIG. 17 is a schematic diagram illustrating a top view of a power semiconductor device according to a second embodiment of the present invention, and FIG. 18 is a schematic diagram illustrating a cross section of FIG. 17 along a cutting line C-C'. As shown in FIG. 17 and FIG. 18, compared with the first embodiment, the interlayer dielectric layer 148 in the termination region 106 does not have the hole in the termination structure 162 of this embodiment. Furthermore, the interlayer dielectric layer 148 and the N-type doped source region 146 in the termination region 106 only have one second contact hole 152, and the drain metal layer 120 is only filled into the second contact hole 152 and disposed on the interlayer dielectric layer 148. In this embodiment, the second trench 114 penetrates through the N-type epitaxial layer 130 and extends to the N-type substrate 128.

Figure 19:
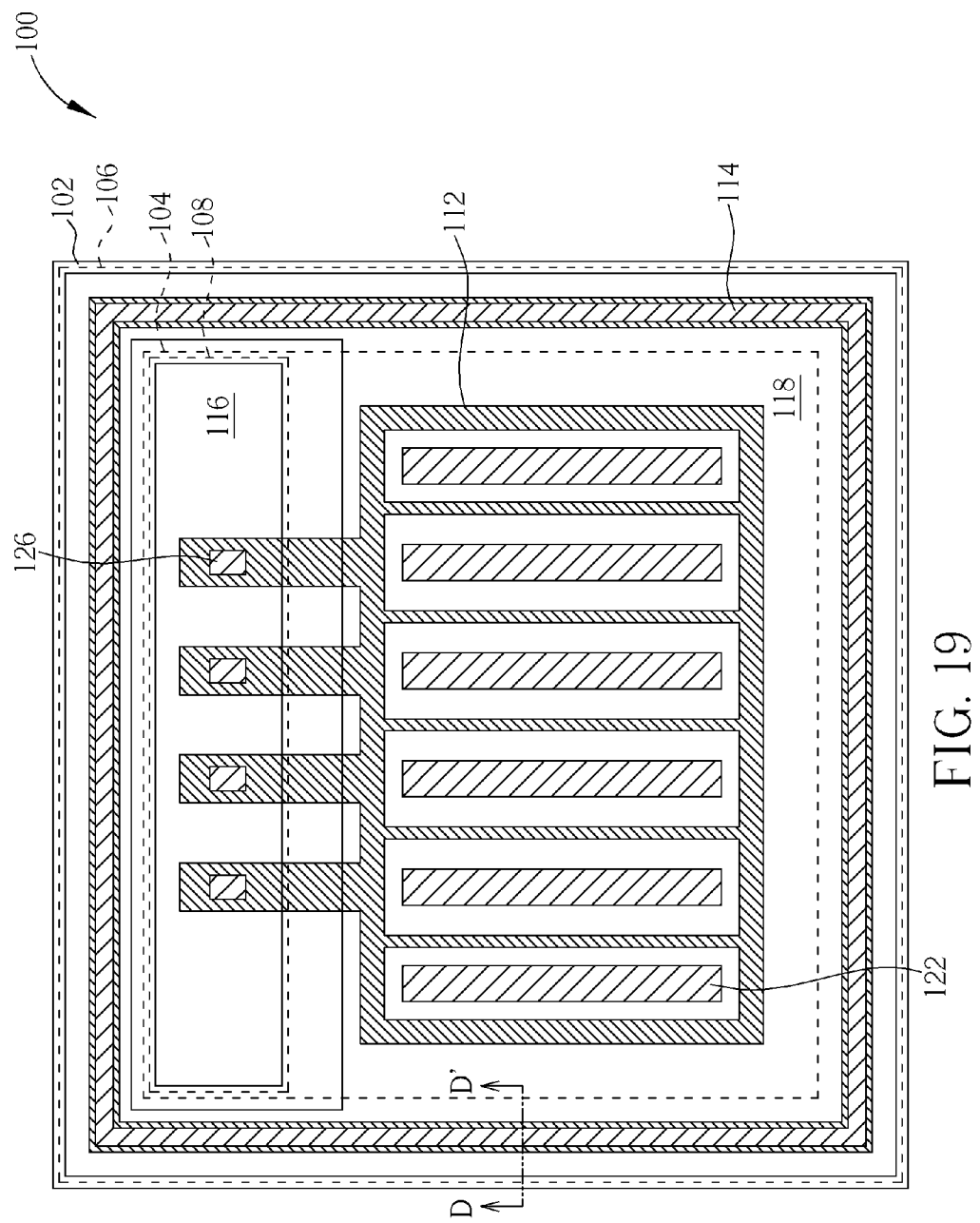
FIG. 19 is a schematic diagram illustrating a top view of a power semiconductor device according to a third embodiment of the present invention.
Figure 20:
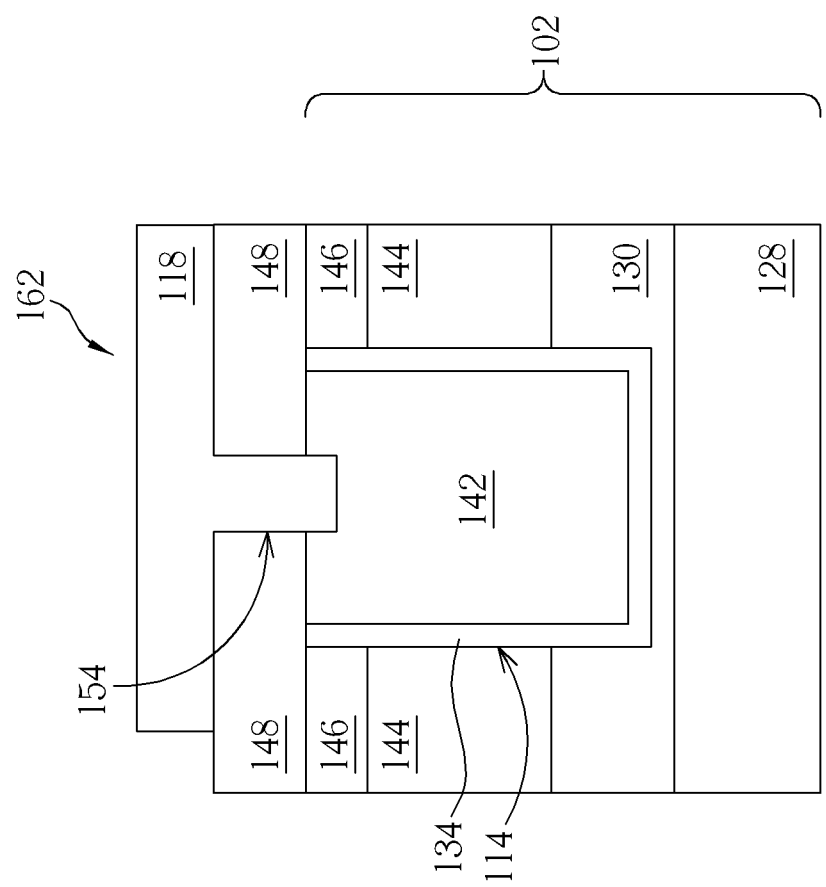
FIG. 20 is a schematic diagram illustrating a cross section of FIG. 19 along a cutting line D-D'.

Refer to FIG. 19 and FIG. 20. FIG. 19 is a schematic diagram illustrating a top view of a power semiconductor device according to a third embodiment of the present invention, and FIG. 20 is a schematic diagram illustrating a cross section of FIG. 19 along a cutting line D-D'. As shown in FIG. 19 and FIG. 20, compared with the first embodiment, the semiconductor substrate 102 of the termination structure 162 in this embodiment does not have the drain metal layer disposed thereon, and the metal layer is a part of the source metal layer 118 extending onto the semiconductor substrate 102 in the termination region 106 and surrounds the gate metal layer 116. Thus, the metal layer is electrically connected to a source of the power semiconductor device 100. Furthermore, the hole 154 on the second insulating layer 142 is filled up with the source metal layer 118, and the source metal layer 118 provides an electric field to the semiconductor substrate 102 in the termination region 106, so that the penetration of the high electric field from the depletion region can be stopped, and the voltage breakdown can be prevented. In this embodiment, the bottom of the hole 154 is disposed between the top surface of the N-type doped source region 146 and the interface between the P-type doped body region 144 and the N-type doped source region 146, and the source metal layer 118 filled into the hole 154 can provide a higher electric field to the semiconductor substrate 102, so that the voltage breakdown can be avoided.

Figure 21:
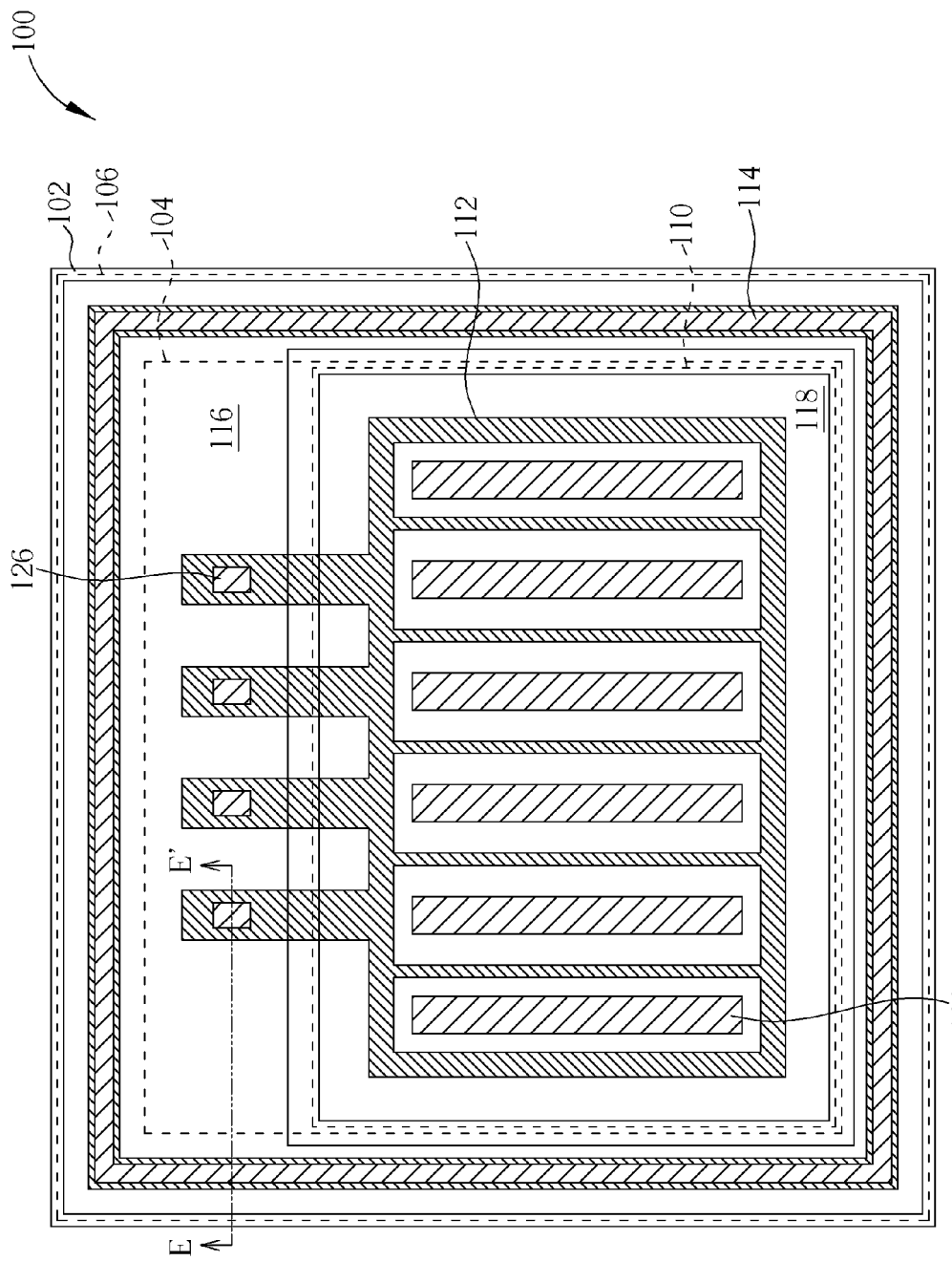
FIG. 21 is a schematic diagram illustrating a top view of a power semiconductor device according to a fourth embodiment of the present invention.
Figure 22:
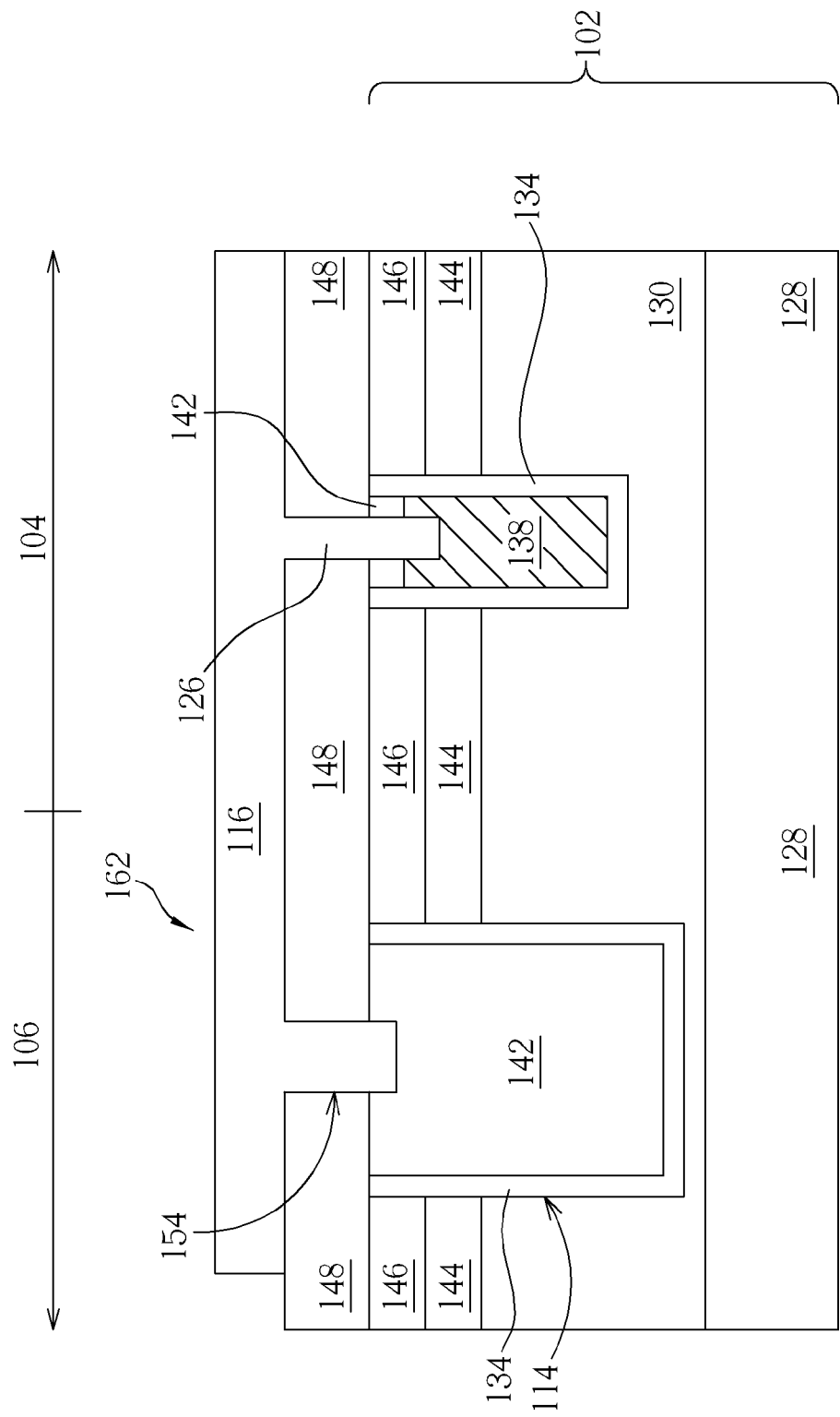
FIG. 22 is a schematic diagram illustrating a cross section of FIG. 21 along a cutting line E-E'.

Refer to FIG. 21 and FIG. 22. FIG. 21 is a schematic diagram illustrating a top view of a power semiconductor device according to a fourth embodiment of the present invention, and FIG. 22 is a schematic diagram illustrating a cross section of FIG. 21 along a cutting line E-E'. As shown in FIG. 21 and FIG. 22, compared with the first embodiment, the semiconductor substrate 102 of the termination structure 162 in this embodiment does not have the drain metal layer disposed thereon, and the metal layer is a part of the gate metal layer 116 extending onto the semiconductor substrate 102 in the termination region 106 and surrounds the source metal layer 118. Thus, the metal layer is electrically connected to a gate of the power semiconductor device 100. Furthermore, the hole 154 on the second insulating layer 142 is filled up with the gate metal layer 116, and the gate metal layer 116 provides an electric field to the semiconductor substrate 102 in the termination region 106, so that the penetration of the high electric field from the depletion region can be stopped, and the voltage breakdown can be prevented. In this embodiment, the bottom of the hole 154 is disposed between the top surface of the N-type doped source region 146 and the interface between the P-type doped body region 144 and the N-type doped source region 146, and the gate metal layer 116 filled into the hole 154 can provide a higher electric field to the semiconductor substrate 102, so that the voltage breakdown can be avoided.

Figure 23:
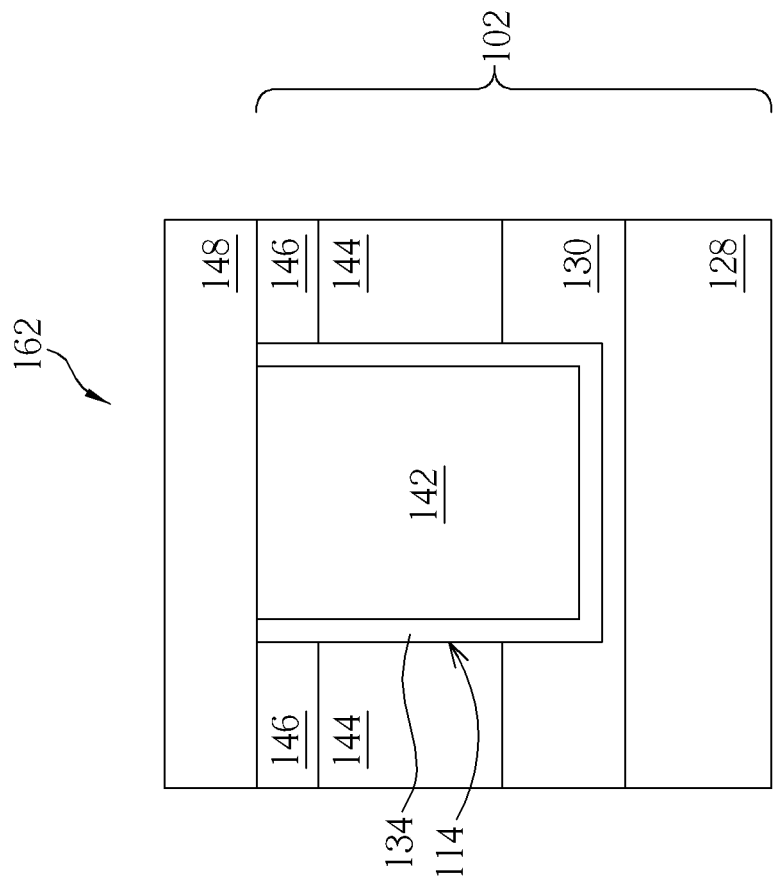
FIG. 23 is a schematic diagram illustrating a cross section of a termination structure of a power semiconductor device according to a fifth embodiment of the present invention.

Refer to FIG. 23, which is a schematic diagram illustrating a cross section of a termination structure of a power semiconductor device according to a fifth embodiment of the present invention. As shown in FIG. 23, compared with the first embodiment, the first insulating layer 134 and the second insulating layer 142 are only filled into the second trench 114, and the semiconductor substrate 102 is covered with the interlayer dielectric layer 148 in the termination structure 162 of this embodiment. Furthermore, the metal layer is not formed on the interlayer dielectric layer 148 in the termination region 106 in this embodiment.

As the above-mentioned description, the manufacturing method of the power semiconductor device in the present invention only requires three photomask to complete the power semiconductor device, so that the number of the photomask can be effectively reduced, and the manufacturing cost is accordingly reduced. Furthermore, the formed trench of the termination structure only requires the width that is between 2 micrometers and 20 micrometers, so that the size of the power semiconductor device 100 can be effectively reduced.

Those skilled in the art will readily observe that numerous modifications and alterations of the device and method may be made while retaining the teachings of the invention.

What is claimed is:

1. A manufacturing method of a power semiconductor device, comprising:

providing a semiconductor substrate, the semiconductor substrate having at least one first trench and a second trench, and the semiconductor substrate having an active region and a termination region, the first trench being disposed in the active region, the second trench disposed in the termination region, wherein the semiconductor substrate has a first conductive type;

forming a gate structure in the first trench, wherein the gate structure comprises a first insulating layer and a gate conductive layer;

forming a second insulating layer to cover the semiconductor substrate, the first trench being filled up with the second insulating layer, and the second insulating layer being filled into the second trench;

removing the first insulating layer and the second insulating layer outside the first trench and the second trench to expose a part of the semiconductor substrate;

forming a doped body region and a doped source region in the exposed semiconductor substrate, wherein the doped body region has a second conductive type, and the doped source region is disposed in the doped body region and has the first conductive type;

forming an interlayer dielectric layer to cover the semiconductor substrate;

forming at least one first contact hole in the interlayer dielectric layer and the doped source region in the active region and forming a second contact hole in the interlayer dielectric layer and the doped source region in the termination region, wherein the second trench is disposed between the second contact hole and the first trench; and forming a source metal layer and a gate metal layer on the interlayer dielectric layer, so that the source metal layer is electrically connected to the doped source region, and the gate metal layer is electrically connected to the gate conductive layer.

2. The manufacturing method of a power semiconductor device according to claim 1, wherein the step of forming the gate structure comprises:

forming a first insulating layer to cover the semiconductor substrate, and the first insulating layer covering the first trench and the second trench; and filling a gate conductive layer into the second trench.

3. The manufacturing method of a power semiconductor device according to claim 2, wherein the step of filling the gate conductive layer comprises:

depositing a conductive layer on the first insulating layer, the first trench being filled up with the conductive layer, and the second trench being partially filled with the conductive layer; and performing an isotropic etching process to remove the conductive layer outside the first trench, so that the first trench is filled with the gate conductive layer.

4. The manufacturing method of a power semiconductor device according to claim 1, wherein a width of the second trench is substantially 5 to 20 times as large as a width of the first trench.

5. The manufacturing method of a power semiconductor device according to claim 1, wherein the second trench is filled up with the second insulating layer.

6. The manufacturing method of a power semiconductor device according to claim 1, wherein the step of forming the second insulating layer utilizes a high density plasma (HDP) chemical vapor deposition (CVD) process.

7. The manufacturing method of a power semiconductor device according to claim 1, wherein a material of forming the second insulating layer comprises oxide, borophosphosilicate glass (BPSG), tetra-ethyl-ortho-silicate (TEOS) or a combination of oxide and TEOS.

8. The manufacturing method of a power semiconductor device according to claim 1, wherein the step of removing the first insulating layer and the second insulating layer outside the first trench and the second trench comprises a chemical mechanical polishing (CMP) process or a photolithography and etching process.

9. The manufacturing method of a power semiconductor device according to claim 1, wherein the step of forming the first contact hole and the second contact hole further comprises a hole in the interlayer dielectric layer on the second trench.

10. The manufacturing method of a power semiconductor device according to claim 9, further comprising forming a drain metal layer on the interlayer dielectric layer in the termination region, and the second contact hole and the hole being filled up with the drain metal layer.

11. The manufacturing method of a power semiconductor device according to claim 1, wherein after forming the first contact hole and the second contact hole, the manufacturing method comprises performing an ion implantation process to form a doped contact region in the doped body region exposed by the first contact hole and the second contact hole respectively.

12. The manufacturing method of a power semiconductor device according to claim 1, wherein the first contact hole is filled up with the source metal layer.

13. The manufacturing method of a power semiconductor device according to claim 1, further comprising forming a drain metal layer on the interlayer dielectric layer in the termination region, and the second contact hole being filled up with the drain metal layer.

* * * * *